United States Patent [19]

Mester

[11] Patent Number: 5,038,350
[45] Date of Patent: Aug. 6, 1991

[54] METHOD AND CIRCUIT APPARATUS FOR DATA WORD ERROR DETECTION AND CORRECTION

[75] Inventor: Roland Mester, Darmstadt, Fed. Rep. of Germany

[73] Assignee: BTS Broadcast Television Systems GmbH, Darmstadt, Fed. Rep. of Germany

[21] Appl. No.: 431,536

[22] Filed: Nov. 3, 1989

[30] Foreign Application Priority Data

Nov. 11, 1988 [DE] Fed. Rep. of Germany ....... 3838234

[51] Int. Cl.$^5$ ............................................. G11B 20/18
[52] U.S. Cl. .................................................. 371/37.4
[58] Field of Search ..................... 371/37.4, 37.5, 37.7, 371/37.1, 37.8

[56] References Cited
U.S. PATENT DOCUMENTS 4,607,367  8/1986  Ive et al. ............................ 371/37.4

Primary Examiner—Stephen M. Baker
Attorney, Agent, or Firm—Frishauf, Holtz, Goodman & Woodward

[57] ABSTRACT

In the detection and correction of errors in the decoding of data words of a series of data word blocks each provided with check words in accordance with a Reed-Solomon code the results of the necessary calculations are precomputed and stored in permanent memory addressable by the corresponding values of syndromes and position designating numbers. In the real time correction of detection errors the predetermined correction result is obtained from the ROM in response to the generated addresses and is then exclusive-OR correlated with the corresponding data words which have been delayed by one block interval in order to correct a correctable error. The amount of ROM storage can be reduced by the use of two ROMs and several registers. Error flags for uncorrectable errors are also passed on to succeeding circuits.

4 Claims, 2 Drawing Sheets

METHOD AND CIRCUIT APPARATUS FOR DATA WORD ERROR DETECTION AND CORRECTION

This invention concerns error detection and correction by means of a Reed-Solomon code in a manner conforming to the Standard for Recording Digital Television Signals on Magnetic Tape in Cassettes published by the European Broadcast Union, in Document Tech. 3252-E.

The standard just mentioned specifies that check words are to be formed according to an RS (Reed-Solomon) block code from the video data words of a video sector defined in that standard. In that procedure two check words are first added to 30 bytes of a column block. The block of 32 byte size so generated is designated as an "outer code" block. 600 of these outer code blocks are then subdivided to 32 times 10 blocks of 60 bytes each, to each of which four check words are added in the line direction. The thus derived blocks of 64 byte size are designated as "inner code" blocks. Then, after carrying a shuffling procedure as specified in the standard, the video data as complemented by the check words are recorded in serial form on magnetic tape.

In reproduction of the recorded video data the serial video data are reconverted into 8-bit wide words and then supplied to a "inner" decoder and then to a first deshuffling device. The block circuit diagram of FIG. 1 shows in a rough way the playback portion in a recording and playback apparatus according to the EBU-Standard Tech. 3252-E. In this playback portion the recorded data signal is picked up by means of playback magnetic heads H1 to H4 from a magnetic tape 1 and then supplied to respective playback processors 2 and 3 related to those heads. For easier visual comprehension only two of the four input signal channels are shown in this block circuit diagram.

In the playback processors 2 and 3 the data signals furnished to them are preamplified, compensated for distortion and converted into a bit-parallel byte form. These playback processors also contain sample rhythm regenerators. The data signals thus prepared are put through inner decoders 4 and 5. Each inner decoder can correct one erroneous data word per inner code block. Furthermore, each inner decoder 4, 5 provides an error flag signal EF when recognized data errors are not correctable.

The data provided at the outputs of the inner decoders 4 and 5 are deshuffled in a first data preparation stage 6 and put together into two channels. The thus decoded and deshuffled data signal, together with the error flag signal EF is then advanced to two outer decoders 7 and 8. Each outer decoder 7, 8 can correct two erroneous data words per outer code block. Furthermore, each outer decoder 7, 8 also generates an error flag signal EF to designate the error location for recognized but uncorrectable data errors.

In a second data preparation stage 9 the outputs of the outer decoders 7 and 8 are combined into a single data stream and, after a further deshuffling, channel decoding and concealment of uncorrectable errors the data stream is made available as a CCIR-601 video data signal for transmission purposes.

A method of recognizing and correcting errors in Reed-solomon coded data signals is known from the book "Practical Error Correction Design for Engineers" (Data System Technology Corp. 1982). Error syndromes are formed (derived) from data and check words put together in blocks. In this operation a linear equation system is to be solved for correction of an error of known location in a Galois field. This linear equation system consists of as many equations (polynomials) as there are errors to be corrected. For solution of the equation system known methods of algebra, e.g. the Gauss algorithm or the Cramer rule, can be used. Since, in the case of the above mentioned EBU-Standard for recording digital video signals, the data rate of the data signal to be processed by outer decoders is 13.5 Mbytes per second, these solution algorithms can not be utilized with conventional logic components or with a microcomputer in real time. Furthermore, errors also appear in an actual recording and playback apparatus which are not marked by an error flag.

SUMMARY OF THE INVENTION

It is an object of the present invention to provide an economical apparatus of the above-described kinds in which real time processing of data signals at data rates equal to and above 10 Mbytes is possible and in which along with the solution of a polynomial representing a Galois field for calculations regarding erroneous bits, a checking of check words in the data signal for plausibility can also be carried out in real time.

Briefly, a read only memory (ROM) is used in which the syndromes and error positions are addresses and at each address a correction result corresponding to the element of a polynomial representing a Galois field is stored in the ROM and when there is present a particular value of the syndrome and error position, the related correction result is read out of the ROM and a correction of the data word that was recognized as erroneous is carried out. The invention has the advantage that not only are data words recognized and corrected in real time, but also data blocks previously recognized as "error free" can be investigated for errors previously impossible to recognize. This result is obtained by replacing the heretofore utilized calculation circuits by tables of the solutions of the polynomials represented in the Galois field, these tables being written into ROM. In the apparatus of the invention the desired result can be produced with only two ROM units.

It is particularly advantageous to proceed by first obtaining, from separate ROMs, partial solutions in the form of expressions of the linear equation system which are not time-critical to calculate, in order to fit the system of the invention to the use of commercially available ROM sizes. In that case, the final ROM is addressed by partial solutions. In that way the provision of special circuit components for this key portion of the circuit can be dispensed with.

BRIEF DESCRIPTION OF THE DRAWINGS

Further detailed features of the invention are better understood with reference to an illustrated description, wherefore the invention is further described below by way of illustrative example with reference to the annexed drawings, in which.

DESCRIPTION OF THE ILLUSTRATED EMBODIMENTS

Figure 1:
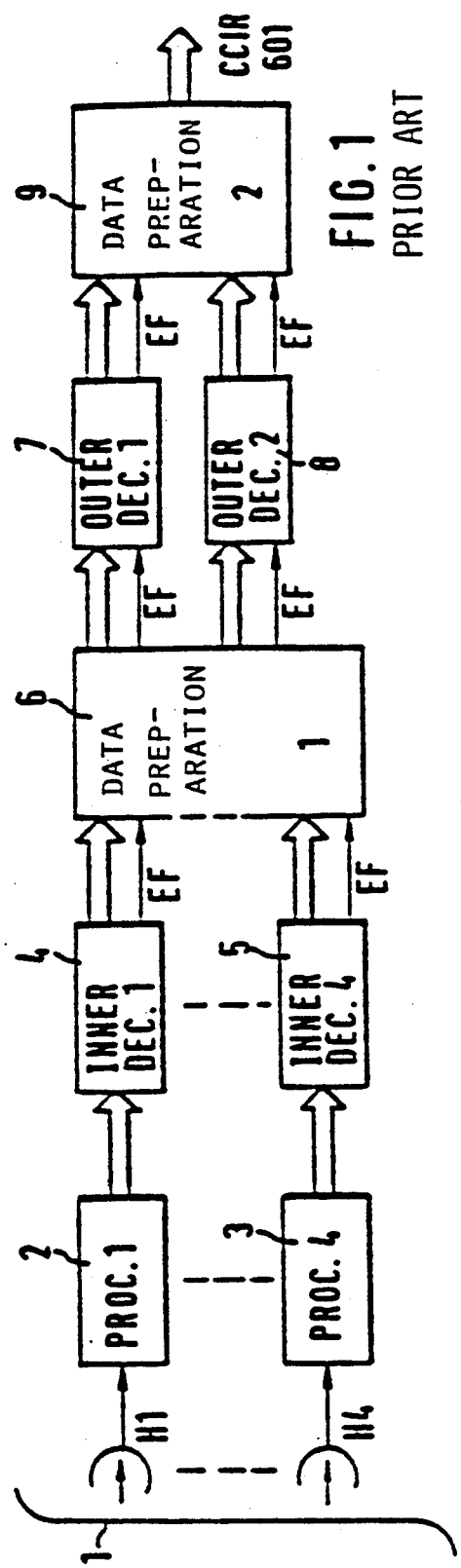
FIG. 1 is a block circuit diagram of a playback portion of a recording and playback magnetic tape equipment conforming with the EBU Standard Tech. 3252-E.

As already mentioned FIG. 1 shows two of the four channels of the playback portion of a magnetic tape recording and playback equipment conforming to the above mentioned EBU-Standard. Each of the channels shown has an outer decoder 7, 8 following the first data preparing stage 6 and an outer decoder 10, 11 following the second data preparation stage 9.

Figure 2:
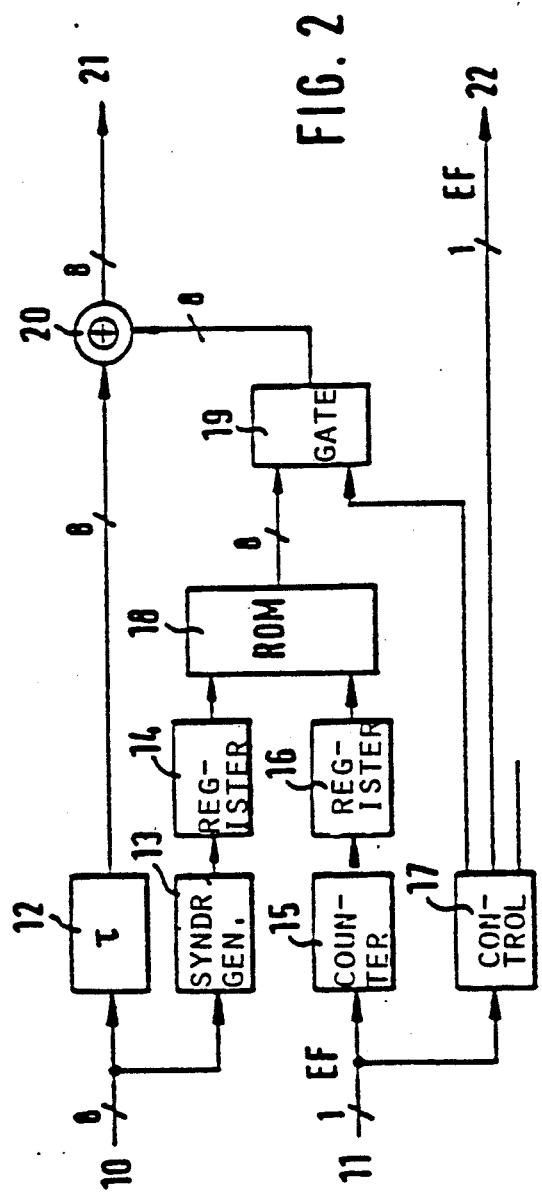
FIG. 2 is a basic block circuit diagram of an outer decoder for the practice of the method of the invention.

FIG. 2 shows an outer decoder for use in the circuit in FIG. 1. The method of the invention will now be explained with reference to FIG. 2.

For this purpose it will be assumed that an 8-bit wide data signal is present at the input 10 which has a data rate of 13.5 Mbytes per second. At the input 10 an error flag EF is present at the same time as a particular erroneous bit word is present at the input 10. Both of these signal inputs are generated in a manner already known by the inner decoder mentioned in the introduction which may be the inner decoder 4 or the inner decoder 5 of FIG. 1.

The error flag designates an error recognized but not corrected by the inner decoder The 8 bit wide data words of the data signal are supplied to a delay device 12 and to a syndrome generator 18. Syndromes generators generate information regarding errors that occur in data signals, which information is independent of the data content.

Such a syndrome generator is described in my prior application Ser. No. 07/198,131, filed May 24, 1988, U.S. Pat. No. 4,914,661.

In the present case syndromes of an error-protected data block are first generated for error correction and are temporarily stored in a register 14. In addition to these syndromes position-designating numbers are needed for correction of the two correctable errors among those recognized. For this purpose a counter 15 is provided which counts out the error flags 11 and thereby determines the position in each block. When an error appears the counter 15 is stopped and the count value present at the output of the counter 15 is temporarily stored in a register 16. Both the syndromes and the count values are stored for the duration of an outer code block which is 32 bytes long. The control and clocking of the individual blocks of the illustrated outer decoder is performed by a control unit 17 which also responds to the error flag present at the input 11. The outputs of the registers 14 and 16 are connected with the address inputs of the ROM 18. In this ROM 18 there is stored at each address a result of the correction operation. The precalculated correction result is read directly out of the ROM 18 in response to the particular address value obtained from the registers 14 and 16 and is supplied through a gate circuit 19 to a correction implementing circuit 20 which has another input connected to an output of the delay device 12. The correction results read from the memory 18 applied to the input of the gate circuit 19 are released from the gate circuit by a gate pulse signal provided by the control unit 17. The correction circuit 20 consists essentially of an exclusive-OR logic unit, which provides correspondingly corrected data at its output 21.

As mentioned above, the illustrated outer decoder dealing with Reed-Solomon coding performed in accordance with the EBU-Standard can correct only a limited number of errors per code block. Additional errors, i.e. uncorrectable errors, are designated by a new error flag EF at the output 22 of the control unit 17. This error flag EF serves to control error concealment equipment provided in following circuits.

Figure 3:
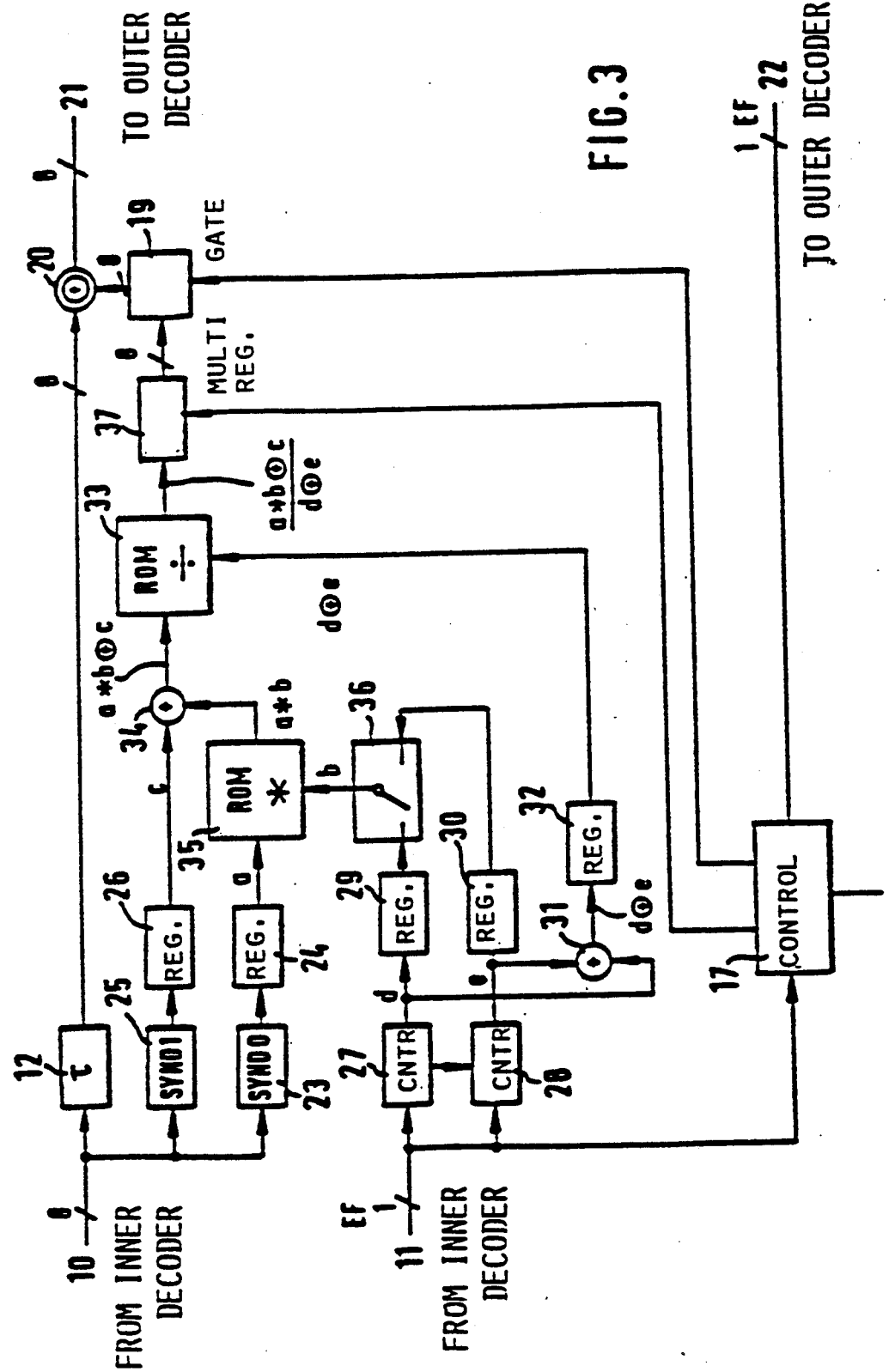
FIG. 3 is a detailed circuit diagram of a preferred embodiment of an outer decoder for the practice of the invention.

Further details of a preferred outer decoder will now be provided with reference to the more detailed circuit block diagram of FIG. 3. The circuit blocks having the same function as circuit blocks shown in other figures are here designated with the same reference numbers and legends. Only the elements necessary for understanding the present invention are shown in this circuit block diagram. In contrast with the circuit block diagram of FIG. 2, in which an ROM having the capacity of more than 4000 kbytes must be provided, an embodiment shown in FIG. 3 operates with ROMs of substantially smaller storage capacity. This is made possible by providing that calculation operations that are not critical with respect to time are implemented by precalculated partial results. Two separate ROMs are used, one for partial results and one for final correction values.

The law on which the Reed-Solomon code here concerned is based is shown and published in the above-mentioned EBU application Tech. 3252-E, pages 52 to 51. The decoding of the Reed-Solomon code used in an outer decoder requires the solution of two equations of the form $x=(a*b+c)/(d+e)$ in a finite field. The coefficient a is generated by a syndrome generator 23 and temporarily stored in a register 24. Another syndrome generator 25 generates the coefficient which is made available at the output of a register 26. The counters 27 and 28 are provided for deriving the position designation numbers for two correctable errors. When a first error appears the counter 27 is stopped, whereas the counter 28 stops at the position designation number which is present either when a second error appears or when the last word of a data block passes.

The values d and e of the respective position designating numbers are temporarily stored in respective registers 29 and 30. These values d and e of the respective position designating numbers are also correlated in an exclusive-OR addition stage 31 to provide the expression $d+e$. This expression is stored temporarily in a register 32 and is supplied as the divisor to address inputs of a ROM 33. Other address inputs of the ROM 33 connected to the output of the stage 34 which serves for exclusive-OR addition of the coefficients c and $a*b$. The product $a*b$ is obtained from a ROM 35 in which 64 kbyte tables of the precalculated products of the factors a and b are stored. The factor b is made available by a controlled switch 36 which is connected with the registers 29 and 30. According to the position of the switch contacts of the switch 36 one of the two equations set forth below are solved:

$$x=(a*d+c)/(d+e)$$

$$x=(a*e+c)/(d+e).$$

In a manner similar to the operation with the ROM 35 the precalculated quotients are stored in the ROM 33 in 64 kbyte tables. At the output of the ROM 33, correction results are thus made available which are in the form $x=(a*b+c)/(d+e)$, in each case temporarily stored in a multiple register 37 in order to bridge over the calculation time which lasts for a block period. The multiple register 37 contains two registers which always stand ready for write-in in order to receive calculation results of two error values. Two additional registers of the multiple register 37 are in the meanwhile always switched over for read-out. The correction results that are read out, after being released through the circuit 19, undergo an exclusive-OR correlation with the correction circuit 20 with the data at the output of the delay unit 12. The write-in and read-out sides of the multiple register 37 are interchanged after each block. In order to wait for the time of a block length for the end of the error calculation, each data block is delayed for one block length in the dealy unit 12. The control circuit 17 which counts the input error flags and evaluates the results of the syndrome generators 23 and 25 takes charge of the control of the error correction operation and the provision of output error flags. The control unit 17 also derives conclusions regarding correctability and detection of erroneous data. In particular the control unit 17 can selectively control the number of errors to be corrected.

Although the invention has been described with reference to a particular illustrative example, it will be recognized that modifications and variations are possible within the inventive concept.

What is claimed is:

1. Outer decoder apparatus for correcting correctable errors and data words in outer code blocks of a digital data signal which also include check words, said outer code blocks being supplied to a first input (10) of said apparatus by a data converter to which inner code blocks of said digital data signal are supplied after processing by an inner decoder with error correction so far as possible by said inner decoder and supplemented with error flags furnished by said first data converter to said outer decoder at a second apparatus input (11) thereof, said outer decoder apparatus comprising:

means (12) for delaying said outer code blocks supplied at said first input of said outer decoder apparatus by said conversion means and having an output for providing said outer code blocks delayed for a code block interval;

first and second syndrome value generators (23, 25) both connected to said first input of said outer decoder apparatus and respectively having outputs;

first and second registers (24, 26) respectively connected to said outputs of said first and second syndrome generators for temporary storing of first and second syndrome values respectively produced by said first and second syndrome generators (23, 25) and respectively having outputs;

first and second counters (27, 28) connected to said second input of said outer decoder apparatus for respectively counting out first and second error flags, if any, corresponding to each data block;

a first exclusive-OR correlation circuit (31) having inputs respectively connected to said outputs of said first and second counters and having an output;

third and fourth registers (29, 30) for respectively storing values respectively furnished by said outputs of said first and second counters (27, 28);

a fifth register (32) for storing values provided at said output of said first exclusive-OR correlation circuit (31);

a first fixed-value memory (33) having address inputs connected to outputs of said first, second, third, fourth and fifth registers and having an output, said first fixed-value memory having stored therein correction values corresponding to combinations of syndrome values and error location numbers, said numbers corresponding to states of said first and second counters, and a correction stage (17, 19, 20) having one input connected to said output of said first fixed-value memory (33) and a second input connected to said output of said delay means (12) and having an output (21) at which said digital data signal corrected for correctable errors is made available.

2. Outer decoder apparatus according to claim 1, wherein a second fixed value memory (35) and a second exclusive-OR correlation circuit (34) having one input connected to the output of said second fixed value memory and a second input connected to said second register (26) are interposed between a first address input of said first fixed value memory (33) and said first and second registers (24, 26), said second fixed value memory (35) having a first address input connected to said first register (24), having a second address input, and containing precalculated partial correction values;

controlled selector switch means (36) in circuit for providing to said second input of said second fixed value memory (35), in alternation, values of said respective outputs of said first and second counters (27, 28) respectively provided to said switch means through said third and fourth registers (29, 30);

said first fixed value memory (33) having a second address input connected to said fifth register (32) and having its correction value contents stored in the form of quotients of respective dividend and divisor addresses furnished respectively by said second exclusive-OR correlation circuit (34) and said fifth register (32);

a multiple register (37) interposed between said first fixed value memory (33) said correction circuit (19, 20) for storing said correction values provided by said first fixed value memory (33).

3. Outer decoder apparatus according to claim 2, wherein said correction circuit (17, 19, 20) contains a gate circuit (19) interposed between the output of said multiple register (37) and a component (20) of said correction circuit also connected to said output (21) thereof and to said delay means (12), said correction circuit also including a control circuit 17 connected to said second input (11) of said outer decoder apparatus for timing said multiple register and said gate circuit.

4. Outer decoder apparatus according to claim 3, wherein said control circuit (17) of said correction circuit (17, 19, 20) has an error flag output (22) for facilitating the designation of uncorrectable errors.

* * * * *